(12) United States Patent
Pfefferlein et al.

(10) Patent No.: US 11,056,460 B2
(45) Date of Patent: Jul. 6, 2021

(54) METHOD FOR PRODUCING AN ELECTRIC CIRCUIT COMPRISING A CIRCUIT CARRIER, CONTACT AREAS, AND AN INSULATING BODY

(71) Applicant: Siemens Aktiengesellschaft, Munich (DE)

(72) Inventors: Stefan Pfefferlein, Heroldsberg (DE); Thomas Bigl, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 16/481,758

(22) PCT Filed: Jan. 22, 2018

(86) PCT No.: PCT/EP2018/051391
§ 371 (c)(1),
(2) Date: Jul. 29, 2019

(87) PCT Pub. No.: WO2018/138031
PCT Pub. Date: Aug. 2, 2018

(65) Prior Publication Data
US 2019/0393187 A1    Dec. 26, 2019

(30) Foreign Application Priority Data

Jan. 30, 2017  (EP) ..................... 17153734

(51) Int. Cl.
*H01L 23/00* (2006.01)
*H01L 23/498* (2006.01)
(Continued)

(52) U.S. Cl.
CPC ............ *H01L 24/82* (2013.01); *H01L 23/498* (2013.01); *H01L 24/69* (2013.01); *H05K 1/181* (2013.01);
(Continued)

(58) Field of Classification Search
CPC ....... H01L 24/82; H01L 24/69; H01L 23/498; H01L 2224/82101; H01L 2224/82105;
(Continued)

(56) References Cited

U.S. PATENT DOCUMENTS 4,397,803 A * 8/1983 Hall, Jr. ............. G03B 15/0457
264/272.14
4,515,558 A * 5/1985 Hall, Jr. ............. G03B 15/0457
362/10
(Continued)

FOREIGN PATENT DOCUMENTS

EP      2 147 463 A2   1/2010
WO   WO 2008/130493 A2  10/2008
WO   WO 2012/060091 A1   5/2012

OTHER PUBLICATIONS

PCT International Search Report and Written Opinion of International Searching Authority dated Jul. 18, 2018 corresponding to PCT International Application No. PCT/EP2016/054630 filed Jan. 22, 2018.

*Primary Examiner* — Alexander O Williams
(74) *Attorney, Agent, or Firm* — Henry M. Feiereisen LLC

(57) ABSTRACT

A method for producing an electric circuit in which a contact carrier comprising a first contact area and a second contact area is provided. An insulating body is applied to the circuit carrier and at least partially covers the first contact area and the second contact area. The insulating body comprises cut-outs in regions both contact areas. A flowable electrical conducting medium is introduced into the insulating body.

18 Claims, 5 Drawing Sheets

(51) Int. Cl.
　　*H05K 1/18*　　　(2006.01)
　　*H05K 3/28*　　　(2006.01)
　　*H05K 3/34*　　　(2006.01)

(52) U.S. Cl.
　　CPC ........... *H05K 3/284* (2013.01); *H05K 3/3431* (2013.01); *H05K 3/3478* (2013.01); *H01L 2224/82101* (2013.01); *H01L 2224/82105* (2013.01); *H01L 2224/82801* (2013.01); *H01L 2224/82986* (2013.01); *H01L 2924/014* (2013.01); *H05K 2203/046* (2013.01); *H05K 2203/0415* (2013.01); *H05K 2203/1178* (2013.01); *H05K 2203/128* (2013.01)

(58) Field of Classification Search
　　CPC ..... H01L 2225/82801; H01L 2924/014; H01L 2224/82986; H01L 24/24; H01L 2224/24011; H01L 2224/2402; H01L 2224/82007; H01L 2224/24997; H01L 23/00; H05K 3/3478; H05K 3/3431; H05K 1/181; H05K 3/284; H05K 2203/1178; H05K 2203/0415; H05K 2203/046; H05K 2203/128; H05K 3/3484; H05K 3/3468; H05K 1/0265; H05K 2201/0323; H05K 1/0272; H05K 2203/0557; H05K 2201/099; H05K 2203/308; H05K 2201/09872; H05K 2201/09909; H05K 2201/0415; H05K 2203/0126; H05K 3/28; H05K 3/34; H05K 1/18
　　USPC ........................................................ 257/668
　　See application file for complete search history.

(56) References Cited

U.S. PATENT DOCUMENTS

| | | | | |
|---|---|---|---|---|
| 6,344,160 | B1* | 2/2002 | Holtzberg | B29C 33/38 |
| | | | | 264/102 |
| 8,573,800 | B2* | 11/2013 | Urano | F21V 29/763 |
| | | | | 362/218 |
| 9,993,982 | B2* | 6/2018 | Sherrer | B22D 19/00 |
| 2004/0008952 | A1* | 1/2004 | Kragl | G02B 6/4212 |
| | | | | 385/88 |
| 2004/0227235 | A1 | 11/2004 | Hashimoto | |
| 2008/0319898 | A1* | 12/2008 | Crowl | G06Q 40/02 |
| | | | | 705/39 |
| 2015/0157862 | A1* | 6/2015 | Greenberg | H05K 1/11 |
| | | | | 607/60 |
| 2015/0181350 | A1* | 6/2015 | Poupyrev | H04R 7/125 |
| | | | | 381/190 |
| 2015/0311144 | A1* | 10/2015 | Williams | H01L 23/49568 |
| | | | | 257/675 |
| 2016/0351486 | A1* | 12/2016 | Jung | H01L 21/6835 |
| 2017/0178990 | A1* | 6/2017 | Oster | H01L 23/66 |
| 2017/0317223 | A1* | 11/2017 | Betz | H01L 31/02008 |
| 2018/0090448 | A1* | 3/2018 | Kim | H01L 24/48 |
| 2019/0043733 | A1* | 2/2019 | Kapusta | H01L 21/485 |
| 2019/0043810 | A1* | 2/2019 | Kapusta | H01L 21/4857 |
| 2019/0086357 | A1* | 3/2019 | Wilhelm | G01N 27/4035 |
| 2019/0119104 | A1* | 4/2019 | Chen | G01P 15/0802 |
| 2019/0172964 | A1* | 6/2019 | Hermes | G01S 7/4816 |
| 2020/0164645 | A1* | 5/2020 | Cumbie | B41J 2/1637 |
| 2020/0206810 | A1* | 7/2020 | Lavi | B33Y 80/00 |
| 2020/0206972 | A1* | 7/2020 | Sparks | B33Y 80/00 |

* cited by examiner

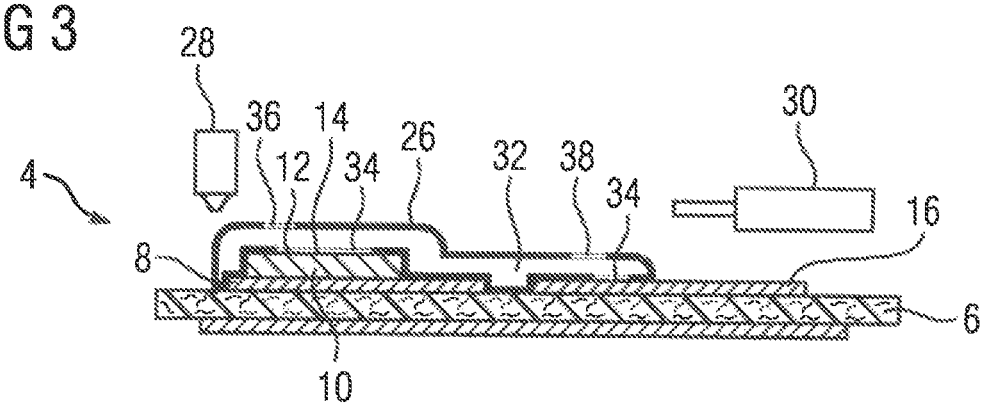
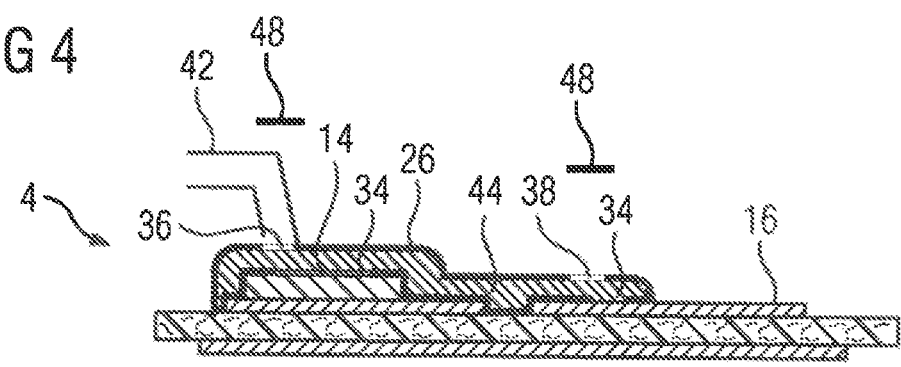
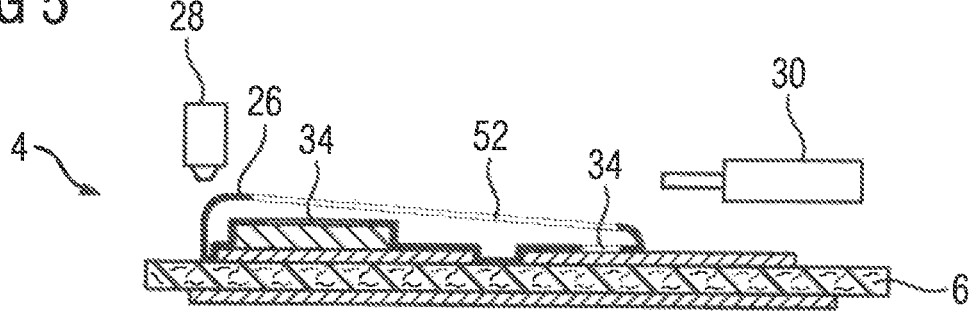

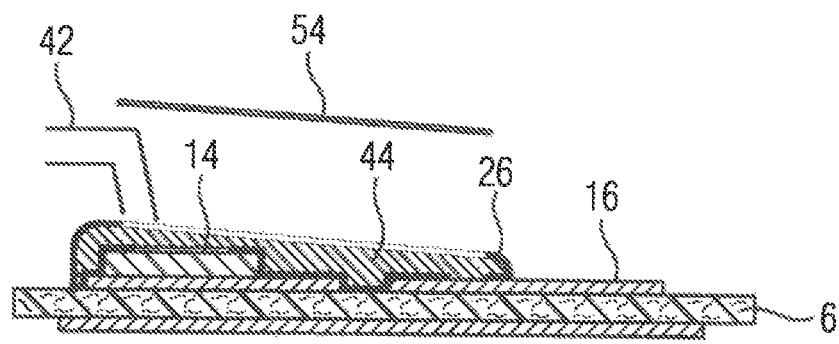
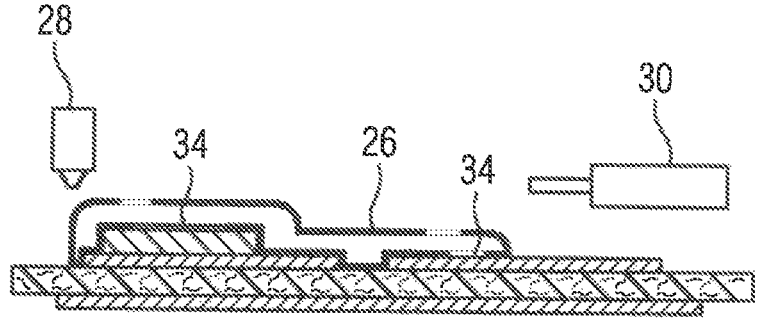
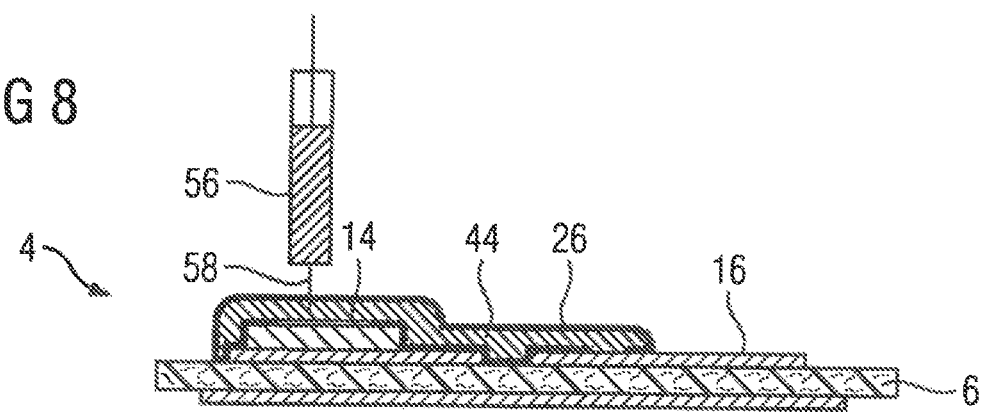

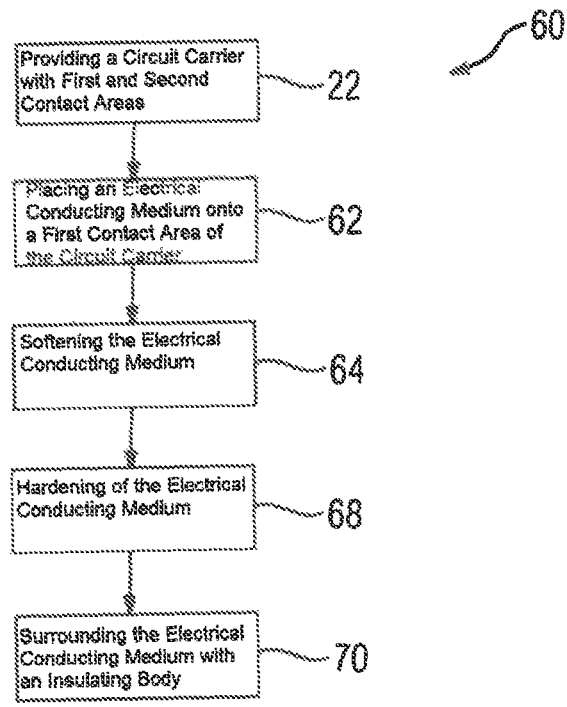
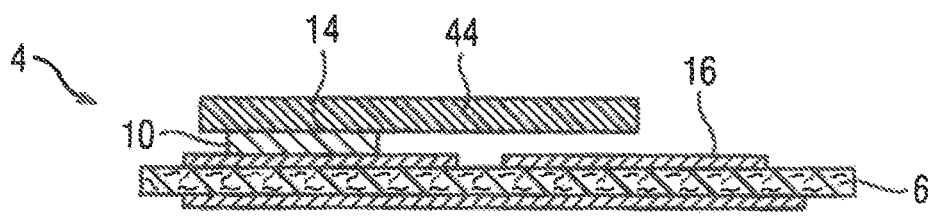

METHOD FOR PRODUCING AN ELECTRIC CIRCUIT COMPRISING A CIRCUIT CARRIER, CONTACT AREAS, AND AN INSULATING BODY

CROSS-REFERENCES TO RELATED APPLICATIONS

This application is the U.S. National Stage of International Application No. PCT/EP2018/051391, filed Jan. 22, 2018, which designated the United States and has been published as International Publication No. WO 2018/138031 A2 and which claims the priority of European Patent Application, Serial No. 171537343, filed Sep. 13, 2006, pursuant to 35 U.S.C. 119(a)-(d).

BACKGROUND OF THE INVENTION

The invention relates to a method for producing an electric circuit, and also to an electric circuit.

Electric circuits usually have a circuit carrier on which electrical and/or electronic components are fastened. The circuit carrier itself is typically made from a glass fiber-reinforced epoxy resin to which conductor tracks composed of copper are attached or in which the conductor tracks are embedded. The electrical or electronic components are in electrical contact with the conductor tracks and fastened thereto. This usually takes place by means of a surface mounting (SMD) technology. Hereby, terminals of the electrical or electronic components or connecting surfaces connected to the conductor track are provided with a soldering paste and the terminals are placed onto the conductor tracks, wherein the solder is subsequently melted in a heating process. Thereafter, the terminals of the electrical or electronic components lie substantially flat on the surface of the circuit carrier.

Particular types of electrical or electronic components, such as in particular, power semiconductor switches, have additional terminals which in the assembled state are spaced apart from the circuit carrier. Thus these components are usually configured to be cuboid and the surface facing away from the circuit carrier comprises or forms the terminal or terminals. For the electrical contacting of this terminal to one of the conductor tracks, a bonding wire is normally used. After fastening the component to the circuit carrier, the bonding wire is guided from the connecting surface of the component to the connecting surface of the conductor track.

In order to provide adequate current-carrying capacity, particularly provided the component is a power semiconductor, the bonding wire must be configured to be comparatively massive or in plural. As a result, a subsequent deformation of this bonding wire is substantially not possible without damage to the electric circuit possibly occurring. Hereby, however, it is required that it is held by means of a tool for mounting. By means of the tool, the bonding wire is guided, it generates the bond connection by ultrasonic welding and also gives the bond wire the required geometric shape, the so-called loop. The geometric shape required for this therefore remains even after the production of the electrical circuit, and for this reason a structural size is increased. In addition, when the electric circuit is installed or when a further component is operated, it can come into mechanical contact with the bonding wire and detach it, for example, from the conductor track or the terminal. In addition, the bonding wire provides an inductance which must be taken into account in the planning and production of the electric circuit.

It is an object of the invention to provide a particularly suitable method for producing an electric circuit, as well as an electric circuit, wherein preferably a temperature-resistance and in particular, a reliability and preferably a design flexibility are enhanced and suitably, production costs are reduced.

SUMMARY OF THE INVENTION

According to one aspect of the invention, this object is achieved by a method for producing an electric circuit, wherein a circuit carrier is provided with a first contact area and with a second contact area, an insulating body is applied to the circuit carrier, wherein the insulating body covers the first contact area and the second contact area at least partially, and wherein the insulating body has a cutout in the region of each of the two contact areas, and a flowable electrical conducting medium is poured into the insulating body.

According to another aspect of the invention, this object is achieved by a method for producing an electric circuit, wherein a circuit carrier is provided with a first contact area and with a second contact area, a solid electrical conducting medium is applied to the circuit carrier, the electrical conducting medium is softened into an at least partially flowable state such that the electrical conducting medium at least partially covers the first contact area and at least partially covers the second contact area, the electrical conducting medium is hardened, and the electrical conducting medium is at least partially surrounded with an insulating body.

According to another aspect of the invention, this object is achieved by an electric circuit which includes a circuit carrier with a first contact area and a second contact area which make electrical contact by means of an electrical conducting medium which is surrounded at least partially by means of an insulating body, and which is produced, in particular, according to a method as set forth above.

Advantageous developments and embodiments are the subject matter of the respective dependent claims.

The method serves for producing an electric circuit. The electric circuit is, for example, a control circuit. In particular, the electric circuit is a component of a converter, such as an inverter or a rectifier. Preferably, the electric circuit is provided to carry an electric current of at least 1 ampere (A), 10 amperes, 20 amperes, 50 amperes or 100 amperes, for example, the current-carrying capacity of the electric circuit is smaller than or equal to 50 kA, 20 kA, 10 kA, 5 kA, 1,000 amperes, 900 amperes or 800 amperes.

The method provides that a circuit carrier is provided with a first contact area and with at least one second contact area. For example, the circuit carrier is manufactured or an already pre-assembled circuit carrier is used. The circuit carrier is, for example, a DCB (direct copper bonding) substrate or a circuit board which comprises, in particular, a substrate composed of a glass fiber-reinforced epoxy resin or other substrate materials such as, for example, an injection molded circuit carrier. The circuit carrier preferably has a conductor track which is attached, for example, to the substrate provided the circuit carrier comprises the substrate.

Preferably, the two contact areas are arranged on the same surface side of the circuit carrier. In particular, the first contact area and/or the second contact area is at least partially formed by one of the conductor tracks or connected to one of the conductor tracks. Suitably, the circuit carrier has an electric or electronic component, in particular a number of such components which, for example, is connected to the substrate or preferably to one of the conductor tracks or to one of the connecting surfaces and, in particular, is in electrical contact with the conductor track. For example, the second contact area is formed with a terminal of the electric or electronic component. Suitably, the electric or electronic component is a power semiconductor. Preferably, the electric or electronic component is a power semiconductor, in particular a power semiconductor switch, such as a field effect transistor, for example, a MOSFET, an IGBT or a GTO. The electric or electronic component is connected, in integrally bonded manner, particularly by means of soldering, sintering or adhering to further components of the circuit carrier such as the substrate and/or one of the conductor tracks and/or one of the connecting surfaces.

The circuit carrier is preferably configured to be substantially flat, wherein, for example, by means of the components or the component, elevations are formed on the surface of the circuit carrier. With the exception of the elevations, the circuit carrier is preferably substantially flat.

The first contact area and the second contact area are preferably arranged parallel to one another. In other words, the first contact area lies in one plane and the second contact area lies in a further plane, wherein the two planes are parallel to one another. Preferably, the two planes are spaced apart from one another, so that the first contact area is offset from the second contact area. Suitably, the first contact area is electrically isolated from the second contact area.

In a further processing step, an insulating body is applied to the circuit carrier. The insulating body is made of an electrically insulating material, for example, a plastic or a silicone. Furthermore, the insulating body is preferably connected to the circuit carrier, preferably fastened thereto, for example integrally bonded, so that the position of the insulating body in relation to the circuit carrier is stabilized. The insulating body is preferably a hollow or trough-shaped body, such as a hollow body, and is arranged such that by means of the insulating body, the first contact area and the second contact area is at least partially covered. In other words, the insulating body abuts both the first contact area and the second contact area and is therefore in direct mechanical contact with them.

The insulating body has a cut-out in the region of each of the two contact areas. The cut-outs are hereby prepared for the respective contact areas and, for example, an edge of the two contact areas or the edge of at least one of the two contact areas, that is, the first contact area or the second contact area is sealed by means of the insulating body so that this contact area is substantially free from the insulating body. At least, by means of the hollow body-like insulating body, for example, a space region is defined, by means of which the first contact area is connected to the second contact area. In other words, by means of the insulating body, a hollow chamber or a trough-shaped body is provided at least in places. The space region (hollow chamber) itself is preferably filled with air or another gas provided the production takes place in a protective atmosphere or suchlike. For example, the cut-out covers only a region of the respectively allocated contact area, wherein in particular a region between the cut-out and the respectively allocated contact area is sealed by means of the insulating body. Summarizing, the insulating body is produced in such a way that, after the mounting on the circuit carrier, it has the two cut-outs which are situated in the region of the two contact areas and which therefore are in contact with the two contact areas. In particular, the two cut-outs are hereby closed by means of the first contact area and by means of the second contact area.

In a further processing step, a flowable electrical conducting medium is introduced into the insulating body. The insulating body is hereby obtained so that the electrical circuit has both the insulating body and also the electrical conducting medium. The electrical conducting medium has a comparatively low electrical resistance and preferably comprises a comparatively high density of freely mobile charge carriers. In particular, the conductivity of the electrical conducting medium is greater than $10^6$ S/m (siemens per meter). The electrical conducting medium is flowable during the processing and is, for example, liquid. Preferably, the viscosity is less than $10^6$ mPa s, $10^5$ mPa s, $10^4$ mPa s, $10^3$ mPa s, 100 mPa s, 10 mPa s or 1 mPa s. At least at the time point of its pouring into the insulating body, the electrical conducting medium is flowable. Suitably, the electrical conducting medium is placed in this state physically or chemically, so that the electrical conducting medium is flowable at the time point of the pouring into the insulating body. As a result thereof, the electrical conducting medium at least partially fills the insulating body, for example, completely, and for this reason the first contact area and the second contact area are in electrical contact by means of the electrical conducting medium, for example, wetted. Preferably, the electrical conducting medium directly mechanically abuts the two contact areas. In particular, the electrical conducting medium partially extends through the two cut-outs in the region of the two contact areas which are preferably closed by means of the two contact areas.

For example, the electrical conducting medium is selected such that it forms an alloy in the region of at least one of the two contact areas, or at least reacts chemically with this contact area. In particular, an integral bonding takes place between the electrical conducting medium and the contact areas. For example, this takes place by means of a so-called binding agent cross-linking, that is by means of a binding agent that is applied to the contact area of the cut-out. In particular, the electrical conducting medium is fluid, paste-like or a so-called pre-form or insert part.

In an embodiment of the invention, the electrical conducting medium is poured into the insulating body, wherein this is present in the solid aggregate state, that is, placed within the insulating body. Subsequently thereto, the electrical conducting medium is softened and is converted into the flowable state, so that it fills the insulating body. In other words, the processing step of pouring the flowable electrical conducting medium into the insulating body and thus the processing step of forming the electrical connection is composed of two steps, wherein firstly the solid electrical conducting medium is placed in the insulating body where it is subsequently softened, which takes place in particular by means of heating. Hereby, the electrical conducting medium is merely heated to a temperature that is below the decomposition temperature of the insulating body, so that it does not become damaged. The electrical conducting medium consequently fills the insulating body substantially completely, so that the two contact areas are in contact with one another by means of the electrical conducting medium. For example, the electrical conducting medium is softened in such a way that it is present in a liquid state. In particular, the electrical conducting medium is a so-called pre-form or insert part. For example, the electrical conducting medium is composed of a solder and, in particular, a "solder pre-form". For its production, the pre-form is preferably placed in the trough-shaped insulating body.

The electrical conducting medium is held in the desired form by means of the insulating body or is brought into a desired shape before solidifying, and for this reason a relatively large quantity of electrical conducting medium can be used. As a consequence, the electrical circuit has a relatively large current-carrying capacity and a relatively high reliability. In addition, the temperature-resistance is increased, since due to the relatively large quantity of electrical conducting medium, heating is relatively low, even with a large current flow. The insulating body can be formed substantially freely and the electrical conducting medium fills the insulating body at least partially. A design flexibility is thereby increased. An installation space is also reduced. In addition, due to the relatively low number of processing steps, production costs are reduced.

For example, an alloy is used as the electrical conducting medium, comprising for example gallium or indium or tin. In other words, the electrical conducting medium comprises at least two components of which one is gallium, indium or tin. In particular, the alloy comprises both gallium and also indium as well as tin. Suitably, the alloy consists of these three components. In particular, the alloy consists of 65% to 96% gallium, of 5% to 22% indium and 0% to 11% tin, wherein preferably at least a non-negligible proportion of tin, which is greater than a typical impurity, is present. Preferably, the proportion of tin is greater than 1% of the total weight. The cited percentage proportions are, in particular, percentages by weight. An alloy of this type is known under the name "Galinstan". Such an alloy is also liquid at room temperature so that the insulating body is filled with a liquid electrical conducting medium, provided the electric circuit is used at room temperature or at least temperatures above −19° C. In this way, a processing is facilitated.

The electrical conducting medium is poured into the insulating body, for example, at a temperature of between 0° C. and 100° C., between 10° C. and 50° C., for example, at a temperature of between 15° C. and 35° C. As a consequence, a physical loading on the insulating body, in particular resulting from an excessive temperature, is reduced, and for this reason relatively economical materials can be used for producing the insulating body. In a further alternative, the electrically conducting medium is for example paste-like and comprises electrically conductive particles, for example, carbon-containing particles or metallic particles which are dissolved, in particular, in a binding agent. Here also, a thermal loading of the insulating body is reduced.

Suitably, as the electrically conducting medium, a medium is used with an electrical conductivity that is less than the electrical conductivity of copper, that is, less than $58 \times 10^6$ S/m (siemens per meter). For example, the conductivity is less than half the electrical conductivity of copper. Thus a relatively economical electrical conducting medium can be used. Since the electrical resistance is determined on the basis of the electrical conductivity and the geometric dimensions, a relatively small ohmic resistance can also be created by means of a relatively large extent. Since the geometric design of the electrical conducting medium can be selected substantially freely by means of the insulating body, the design can be selected to be relatively large. Regions which are mechanically relatively inaccessible and which, for example, lie between two components or in the region of an undercut can therefore also be filled by means of the insulating body and therefore by means of the electrical conducting medium. Due to the relatively large extent, an electrical resistance is reduced, and for this reason the electrical conducting medium with the relatively low conductivity can also be used without an excessive ohmic resistance and therefore an excessive loss and consequently an excessive temperature generation taking place during the operation of the electric circuit.

For example, the electrical conducting medium hardens after its pouring into the insulating body. This takes place, preferably, by means of the addition of a further chemical element so that the chemical composition of the electrical conducting medium changes. Thereby, in particular, an additional metal is added. For example, the electrical conducting medium is heated before its pouring into the insulating body and is transformed into a (viscously) fluid aggregate state. After pouring into the insulating body, the electrical conducting medium is preferably cooled again so that it changes again into the solid aggregate state, wherein however the insulating body is filled by means of the electrical conducting medium. In this way, a robustness is increased. In a further alternative, the electrical conducting medium remains liquid also after the pouring in and, in particular, is a so-called "liquid metal". Suitably, in this case the electrical conducting medium is Galinstan. Hereby, by means of the insulating body, an escape of the electrical conducting medium is prevented.

By means of the insulating body, a short-circuit due to an unintended mechanical contact is prevented. A formation of an electric arc between the electrical conducting medium and further constituents in such a component is also prevented. For example, the insulating body is created by molding, preferably by means of plastic injection molding. Suitably, the material forming the insulating body is poured into a mold that is arranged, for example, on the circuit carrier. Alternatively thereto, the insulating body is produced separately from the circuit carrier and is mounted on the circuit carrier and, in particular, connected thereto only after complete production. For example, hereby a so-called "lost core" is used. In other words, the mold has a core which is destroyed, in particular melted, during the process of the production of the insulating body. As a consequence thereof, the shape of the insulating body can be selected relatively freely so that the electrical conducting medium of the completed electric circuit has the freely selected shape.

In a further alternative, the insulating body is produced by means of 3D printing. In other words, a so-called 3D printer is used for producing the insulating body, wherein the insulating body is preferably printed onto the circuit carrier. Also by means of this method, the shape of the insulating body can be selected relatively freely.

Preferably, an insulating body with an opening is selected, wherein the opening is, for example, a pouring-in opening. By means of the pouring-in opening, the electrically conductive medium is poured into the insulating body, which simplifies the production. Alternatively, the opening is a ventilation opening, through which during the filling of the insulating body, air or another gas situated inside the insulating body can escape so that a mechanical loading of the insulating body is reduced. Preferably, the insulating body comprises at least one pouring-in opening and a ventilation opening. Particularly preferably, the opening, that is in particular, the pouring-in opening or the ventilation opening, suitably all the openings of the insulating body, that is, preferably both the pouring-in opening and also the ventilation opening or the pouring-in opening and/or the ventilation opening is closed after pouring in the electrical conducting medium. The two cut-outs in the region of the two contact areas preferably remain open. Due to the closing, an emergence of the electrical conducting medium from the insulating body is prevented, and for this reason a relatively robust electric circuit is created. Provided the electrical conducting medium remains in a liquid or at least viscous state, an emergence is thus prevented, and for this reason a reliability and robustness of the electric circuit is enhanced.

In an alternative, a trough-like insulating body is used which is thus produced in the manner of a trough or channel. In other words, the insulating body has a substantially U-shaped cross-section at least over a relatively large portion, for example, over half its length, wherein the opening formed by reason of the U-shaped cross-section is preferably directed away from the circuit carrier. As a consequence of such an embodiment of the insulating body, a pouring in of the electrical conducting medium is simplified. In this way, it can also be ensured that the insulating body is filled over relatively broad regions with the electrical conducting medium and that a flow of the electrical conducting medium into particular regions is not prevented, for example, as a result of production tolerances in particular regions due to an undesirable soiling or suchlike.

Preferably, after the pouring in (introduction) of the electrical conducting medium into the insulating body, the insulating body is closed by means of a cover. Suitably, the cover is configured so that after the closing, the electrical conducting medium is substantially completely surrounded by the insulating body and by the cover and by the two contact areas. As a consequence, an emergence of the electrical conducting medium from the insulating body is substantially prevented, even if the electrical conducting medium remains in a liquid state. In addition, an electric short-circuit is prevented.

In a further alternative, the insulating body is completely closed with the exception of the cut-outs assigned to the contact areas. The electrical conducting medium is injected into the insulating body, for example, by means of a needle. Hereby, the insulating body is partially opened by means of the injecting device, wherein the insulating body is preferably elastically deformed in this region. After the pouring in of the electrical conducting medium, the injecting device is removed and the insulating body is closed in the region of the opening, wherein this preferably takes place due to a relaxation of the medium of the insulating body, in particular, independently. For example, the material of the insulating body is matched thereto. In an alternative, the ventilation opening is provided so that any air or another gaseous medium present within the insulating body can escape. In a further alternative, the insulating body is inflated due to the injection of the electrically conducting medium, wherein before the pouring in of the electrical conducting medium within the insulating body, for example, no volume or only a relatively small volume is available, which corresponds, for example, less than or equal to a tenth, 5% or 1% of the electrical conducting medium.

A further method for producing the electric circuit provides that firstly the circuit carrier is prepared with the first contact area and the second contact area. This circuit carrier preferably corresponds to the circuit carrier of the previous method. In other words, the circuit carrier is, for example, a DCB, a circuit board or comprises at least this or an MID (molded interconnect device). In particular, the circuit carrier comprises at least one electric or electronic component which is, for example, a semiconductor switch and/or a power semiconductor, suitably a power semiconductor switch or a diode. The component is connected, for example, by means of sintering, adhering or soldering to further components of the circuit carrier. The two contact areas are preferably parallel to one another and, in particular, are spaced from one another. Suitably, the two contact areas are offset relative to one another, for example, perpendicularly to a plane within which at least one of the two contact areas is arranged. Preferably, the two contact areas are electrically insulated from one another.

In a further processing step, a solid electrical conducting medium is applied to the circuit carrier. For example, the electrical conducting medium lies on an insulation of the circuit carrier. Preferably, the solid electrical conducting medium covers the first and/or second contact area, wherein these do not necessarily need to be touched. Suitably, the solid electrical conducting medium is placed at least partially on the first contact area. For example, the electrical conducting medium is also applied at least partially onto the second contact area so that the electrical conducting medium is electrically in mechanically direct contact both with the first contact area and also with the second contact area. Preferably, in this way, the two contact areas are in electrical contact. However, the electrical conducting medium is at least in mechanically direct contact with the first contact area and consequently is in electrical contact with it. The solid electrical conducting medium is configured, for example, to be cuboid or has another arbitrary or particular form. In particular, the electrical conducting medium is a so-called pre-form or insert part. For example, the electrical conducting medium is composed of a solder and, in particular, a "solder pre-form".

In a further processing step, the electrical conducting medium is at least partially softened so that it transitions to a flowable state. In particular, the conducting medium is heated, wherein the heating is kept below a decomposition temperature. In particular, the electrical conducting medium is not transitioned completely to the liquid state, but is only partially softened, so that it has an increased viscosity. The softening is such that the electrical conducting medium at least partially covers the first contact area and at least partially covers the second contact area, so that the two contact areas are electrically contacted by means of the electrical conducting medium. The electrical conducting medium adapts to the surface of the two contact areas and preferably lies with a large area on the circuit carrier which is provided, for example, with an electrical insulation at least in portions. In particular, a change in the shape of the electrical conducting medium takes place and this is poured, for example, into intermediate spaces provided by means of the circuit carrier.

In a further processing step, the electrical conducting medium is hardened, wherein the electrical conducting medium is preferably cooled. As a consequence, the electrical conducting medium is again present in a solid state. In a further processing step, the electrical conducting medium is at least partially surrounded with an insulating body. The insulating body is made from an electrically insulating material, in particular, a plastic or a silicone. For example, the insulating body is sprayed onto the electrically conducting medium or is applied by means of 3D printing.

Suitably, the electrical conducting medium is surrounded substantially completely, with the exception of the mechanical contact to the circuit carrier, in particular with the exception of the mechanical contact to the two contact areas, by means of the insulating body, so that all the surfaces not abutting the circuit carrier are surrounded by means of the insulating body. As a result, an electrical short-circuit during operation is prevented.

With this production method also, an electrical conducting medium with a relatively large mass can be used, so that an electrical resistance and thus an electrical loss which leads to a temperature increase is relatively low. In addition, the electrical conducting medium adapts to the surface of the circuit carrier. As a result, the electrical conducting medium is stabilized by means of the surface of the circuit carrier, which increases a reliability. An installation space requirement is also reduced so that the flexibility is increased. Furthermore, relatively few processing steps are required for the production, which reduces production costs. In addition, the electrical conducting medium does not have to be specially produced, which further reduces production costs.

Preferably, before the placement on the circuit carrier, the electrical conducting medium has a portion on which a tool can engage, so that the placement on the circuit carrier is facilitated. In particular, this portion is reduced or entirely removed due to the softening, and for this reason the installation space requirement of the electric circuit is reduced. Due to this portion, production is simplified.

The electric circuit comprises a circuit carrier which comprises a first contact area and a second contact area. The circuit carrier is, for example, a circuit board or an MID, and the first contact area and/or the second contact area are at least partially formed by means of a conductor track or a portion of a conductor track. In particular, the first contact area and/or the second contact area is formed by means of a copper track. Particularly preferably, at least one of the contact areas is formed by means of a terminal of an electric and/or electronic component which is placed on further constituents of the circuit carrier, such as a terminal pad connected to a conductor track and, in particular, is in electrical contact with it. The two contact areas are preferably arranged parallel to one another and, in particular, offset from one another and are suitably situated on the same side of the circuit carrier. Preferably, the two contact areas are mechanically spaced from one another.

The two contact areas are in electrical contact with one another by means of an electrical conducting medium which is surrounded at least partially by an insulating body. The electrical conducting medium is, for example, solid or liquid. In particular, the electrical conducting medium is flowable, that is, suitably viscous, at least at the operating temperature of the electric circuit. The insulating body is made, for example, from a plastic or a silicone.

Preferably, the electric circuit is produced according to a method in which, in one processing step, the circuit carrier with the contact areas is provided. In a further processing step, the insulating body is mounted on the circuit carrier, wherein the insulating body at least partially covers the first contact area and at least one second contact area, and wherein the insulating body has a cut-out in the region of each of the two contact areas. In a further processing step, the flowable electrical conducting medium is poured into the insulating body.

Another method for producing the electric circuit provides that firstly the circuit carrier is prepared with the first contact area and at least a second contact area. In a further processing step, the solid electrical conducting medium is placed at least partially on the first contact area, in particular at least partially on the second contact area. In a further processing step, the electrical conducting medium is at least partially softened into an at least partially flowable state such that the electrical conducting medium at least partially covers the first contact area and at least partially covers the second contact area. In other words, a constituent of the electrical conducting medium flows onto the first contact area and the second contact area. In a further processing step, the electrical conducting medium is hardened. In a further processing step, the electrical conducting medium is hardened so that it is again transitioned into the solid state.

In a further processing step, the electrical conducting medium is at least partially surrounded by the insulating body.

The embodiments and developments made in relation to the method for producing the electric circuit are similarly to be applied to the electric circuit and vice versa.

BRIEF DESCRIPTION OF THE DRAWING

Exemplary embodiments of the invention will now be described in greater detail making reference to the drawings, in which:

FIG. 9 shows a further method for producing an electric circuit, and FIGS. 10-13 each show a lateral sectional view of the electric circuit in intermediate stages of the production.

Parts which correspond to one another are provided with the same reference characters in all the figures.

DETAILED DESCRIPTION OF PREFERRED EMBODIMENTS

Figure 1:
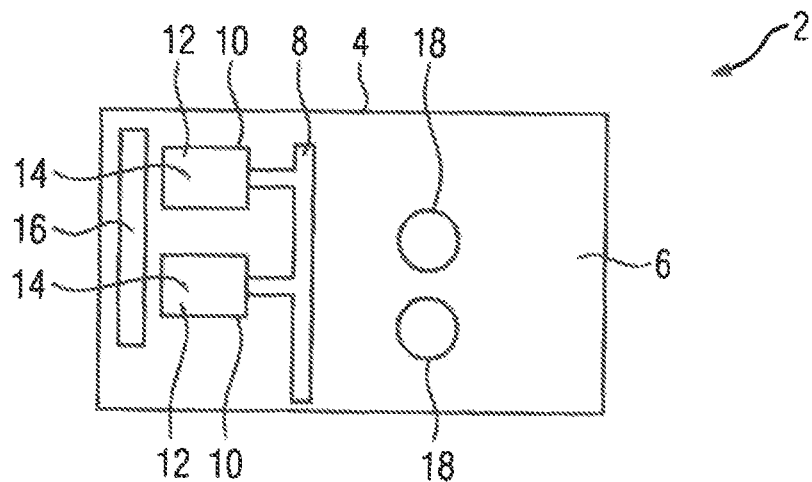
FIG. 1 shows a schematic representation of an electric circuit in a plan view.

FIG. 1 shows a schematic plan view of an electric circuit 2 which is a component of an inverter (not shown in detail). The electric circuit 2 has a circuit carrier 4 which comprises a substrate 6 which is produced from a glass fiber-reinforced epoxy resin or in other alternatives, from ceramic (DCB) or thermoplastic material (MID). Connected to the surface of the substrate 6 is a conductor track 8 that is made from a copper or another electrically conductive material, for example, silver or gold. Connected to the conductor track 8 are two power semiconductors 10, for example, power semiconductor switches or diodes, soldered on by means of SMD technology and therefore in contact both mechanically and electrically with the conductor track 8. Alternatively, the power semiconductors 10 are connected by means of sintering, adhering or soldering to the conductor track 8, wherein for example, a THD technology is used.

The power semiconductors 10 each have a terminal 12 on the side facing away from the substrate 6, which is in electrical contact in a manner not shown in detail with a further conductor track. The conductor track 8 forms a first contact area 14, and each terminal 12 forms a second contact area 16. Hereby, the contact areas 14, 16 lie in different planes and are parallel to one another. The circuit carrier 4 also has further electric or electronic components 18 which are in electrical contact with further conductor tracks (not disclosed in detail). The components 18 are, for example, capacitors.

Figure 2:
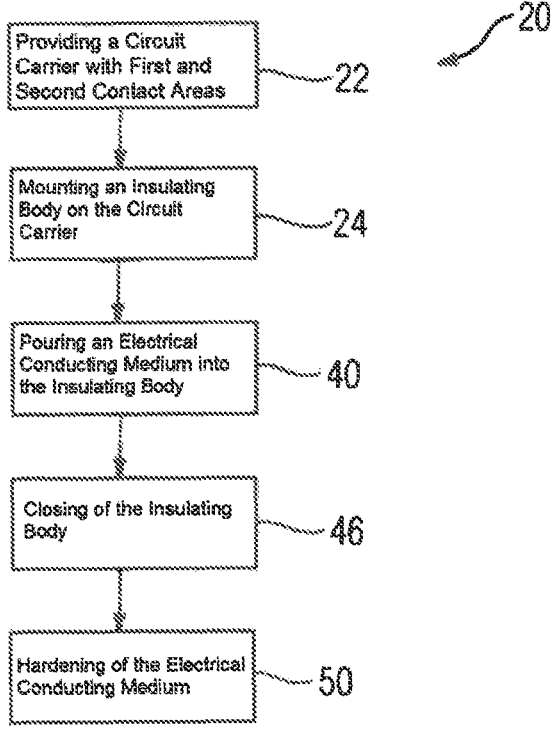
FIG. 2 shows a method for producing an electric circuit, FIGS. 3-8 each show a lateral sectional view of the electric circuit in intermediate states of production.

FIG. 2 shows a method 20 for producing the electric circuit 2. In a first processing step 22, the circuit carrier 4 is provided with the first contact area 14 and the second contact area 16. For this purpose, the substrate 6 and the conductor track 8 is initially produced as the first contact area 14 to which the power semiconductors 10 are connected by means of SMD technology or another technology.

In a second processing step 24, an insulating body 26 made of a plastic or a silicone is mounted on the circuit carrier 4. The insulating body 26 is hereby produced, for example, separately from the circuit carrier 6 or is created directly thereon. The insulating body 26 is printed onto the circuit carrier 4 by means of a 3D printer 28. In an alternative thereto, a molding device 30 is used. The insulating body 26 is a hollow body and for the molding of the insulating body 26 by means of the molding device 30, a so-called "lost core" is used, which is destroyed during the molding of the insulating body 26, wherein a hollow space 32 of the insulating body 26 is created, as shown in FIG. 3. The insulating body 26 covers the first contact area 14 and the second contact area 16 at least partially, wherein the insulating body 26 has a cut-out 34 in the region of each of the two contact areas 14, 16. The two cut-outs 34 are closed by means of the respectively assigned contact areas 14, 16. The insulating body 26 further comprises a pouring-in opening 36 and a ventilation opening 38, which are situated on the side of the insulating body 26 facing away from the circuit carrier 4. An insulating body 26 is assigned to each of the power semiconductors 10, wherein the two insulation bodies 26 are spaced from one another. In a further alternative, the insulating body 26 extends over a plurality of power semiconductors 10, for example two power semiconductors 10, in particular in the case of a half-bridge.

In a third processing step 40, by means of a pouring-in device 42 which is, for example, a nozzle, a flowable electrical conducting medium 44 is poured in though the pouring-in opening 36 into the insulating body 26 and also runs into the cut-outs 34 of the insulating body 26. Air situated in the hollow space 32 emerges through the ventilation opening 38. The electrical conducting medium 44 fills the insulating body 26 substantially completely. The electrical conducting medium 44 is an alloy which has an electrical conductivity that is less than half of the electrical conductivity of copper and, for example, is substantially equal to a quarter of the electrical conductivity of copper. The electrical conducting medium 44 is in a solid aggregate state at room temperature and is heated before the pouring in, wherein the heating is lower, however, than the decomposition temperature of the electrical conducting medium 44 and is lower than the decomposition temperature of the insulating body 26.

In a fourth processing step 46, the pouring-in opening 36 and the ventilation opening 38 are each closed by means of a cap 48, so that an emergence of the electrical conducting medium 44 from the insulating body 26 is prevented. The caps 48 are made of the same material as the insulating body 26 and are preferably also produced by means of 3D printing or molding. In a subsequent fifth processing step 50, the electrical conducting medium 44 is hardened. For this purpose, it is cooled. In a further alternative, the electrical conducting medium 44 is hardened with the openings 36, 38 open. Hereby, in particular, the caps 48 are dispensed with and the openings 36, 38 remain in existence. Alternatively, in this case also, the openings 36, 38 are closed by means of the caps 48.

In a further alternative, the caps 48 are not made of the same material as the insulating body 26. In a further alternative, the caps 48 are provided as semifinished products (plugs) and are not produced by 3D printing or molding. The fifth processing step 50 can also be entirely omitted if the electrical conducting medium 44 remains enclosed by the caps 48.

By means of the electrical conducting medium 44, the first contact area 14 and the second contact area 16 are in electrical contact with one another, wherein the insulating body 26 and via this therefore the electrical conducting medium 44 abuts the circuit carrier 4 over a relatively large area, so that it is stabilized by means of the circuit carrier 4. As a result, a reliability is increased and a relatively large quantity of the electrical conducting medium 44 can be used, and for this reason an electrical resistance is relatively low, which increases the temperature resistance.

If the electrical conducting medium 44 is again transitioned into the liquid state during operation, a so-called self-healing process takes place so that a relatively long operating life of the electric circuit 2 is also enabled. A possible maximum operating temperature is also not limited by reason of the electrical conducting medium 44, but only by the maximum operating temperature of the insulating body 26.

FIG. 5 shows an alternative embodiment of the insulating body 26 according to FIG. 3, which is created in the second processing step 24 by means of the 3D printer 28 or the molding device 30. This insulating body 26 also has the two cut-outs 34 and is accordingly assigned to the insulating body 26 shown in FIG. 3. The insulating body 26 is configured to be trough-like and thus has a relatively large opening 52 on the side facing away from the circuit carrier 4. In particular, the insulating body 26, as shown here, has no wall there, so that the insulating body 26 is configured to be substantially U-shaped.

In this insulating body 26 also, in the third processing step 40, the flowable electrical conducting medium 44 is poured in and, after the pouring in of the electrical conducting medium 44, the insulating body 26 is closed with a cover 54. The cover 54 is created from the same material as the insulating body 26. Then, the fifth processing step 50 is carried out and the electrical conducting medium 44 is hardened. In a further alternative, the electrical conducting medium 44 is hardened with the insulating body 26 open. Hereby, for example, the insulating body 26 remains open or is subsequently closed by means of the cover 54.

In further alternatives, the cover 54 does not have to be created from the same material as the insulating body 26. For example, the cover 54 is prepared as a semifinished product. The fifth processing step 50 can also be entirely omitted if the liquid electrical conducting medium 44 remains enclosed by the cover 54.

FIG. 7 shows a further embodiment of the insulating body 26, which is created in the second processing step 24 by means of the 3D printer 28 or the molding device 30, wherein during molding, an opening is preferably available in order to remove the core, provided it cannot remain and be dissolved by the electrical conducting medium 44. With the exception of the cut-outs 34, the insulating body 26 has no further openings and is therefore configured to be closed. The insulating body 26 is itself arranged such that it covers the first contact area 14 and the second contact area 16 at least partially, and the insulating body 26 has the cut-outs 34 in the region of each of the two contact areas 14, 16.

As shown in FIG. 8, the electrical conducting medium 44 is injected into the insulating body 26 by means of an injecting device 56. Hereby, the insulating body 26 is opened at a point by means of a needle 58 of the injecting device 56 and the electrical conducting medium 44 is pressed into the hollow space 32. Once the insulating body 26 is filled by means of the electrical conducting medium 44, the needle 58 is removed from the insulating body 26 and, due to an elastic restoration of the insulating body 26, the point opening that was formed by the needle 58 is closed autonomously.

In further embodiments, an electrical conducting medium 44 is made use of which is also present in a liquid aggregate state at room temperature. For hardening, in the fifth processing step 50, an additional material, in particular a metal, is added so that the alloy composition of the electrical conducting medium 44 is changed. In this case, this alloy is present in the solid aggregate state at room temperature. In a yet further alternative, the fifth processing step 50 is entirely omitted and the electrical conducting medium 44 is also present in the liquid aggregate state at room temperature. Hereby, in a preferred alternative, an alloy which comprises gallium, indium and tin is used as the electrical conducting medium 44, wherein the proportion of gallium is between 65% and 95% by weight, the proportion of indium is between 5% and 22% by weight and the proportion of tin is between 0% and 11% by weight. In particular, the so-called Galinstan is used as the alloy.

Figure 11:
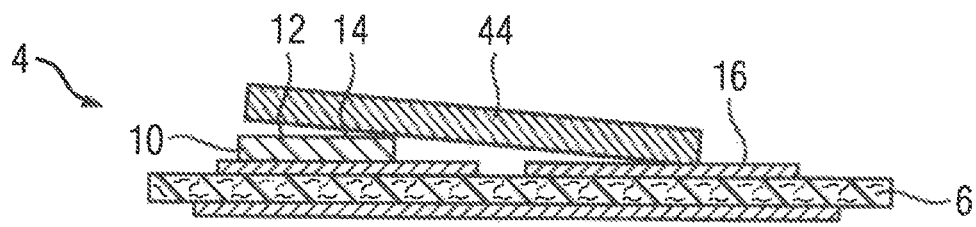
Figure 12:
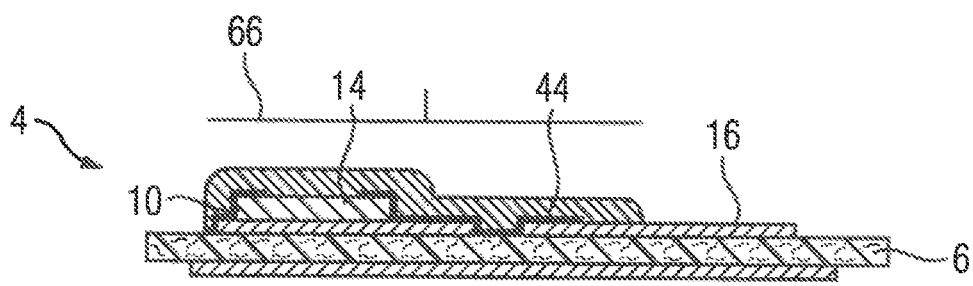
Figure 13:
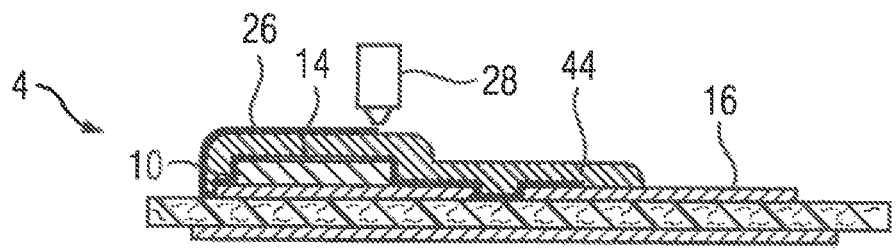

FIG. 9 shows a further method 50 for producing the electric circuit 2. Here also, the first processing step 22 is carried out and the circuit carrier 4 is provided with the first contact area 14 and the second contact area 16. In a subsequent sixth processing step 62, the electrical conducting medium 44, which is present in the solid aggregate state is partially placed onto the first contact area 14, wherein the electrical conducting medium 44 is spaced apart from the second contact area 16, although in a projection onto the substrate 6, it covers it. The first contact area 14 is substantially completely covered by means of the electrical conducting medium 44. The electrical conducting medium 44 is a solder preform, as shown in FIG. 10. In an alternative, as shown in FIG. 11, the electrical conducting medium 44 is partially placed both onto the first contact area 14 and also onto the second contact area 16, so that it is in direct mechanical contact with the two contact areas 14, 16. In a further alternative, the electrical conducting medium 44 initially lies only on the insulation. The final contact with the contact area 14 and 16 then takes place in a further processing step.

In a seventh subsequent processing step 64, the electrical conducting medium 44 is softened by means of a heating device 66, so that it transitions partially into the flowable state. Hereby, the electrical conducting medium 44 is not completely liquefied, but merely transitions into a viscous state. As a result, the electrical conducting medium 44 conforms to the circuit carrier 4, and the first contact area 14 and the second contact area 16 are at least partially covered by the electrical conducting medium 44. The electrical conducting medium 44 lies on the circuit carrier 4 over a large area. Hereby, the electrical conducting medium 44 either directly abuts the circuit carrier 4 mechanically, or via possible insulations (not shown in detail), so that an unwanted short-circuit is prevented. No hollow space or the like is formed, at least between the circuit carrier 4 and the electrical conducting medium 44.

In a subsequent eighth processing step 68, the electrical conducting medium 44 is hardened, which is achieved by cooling. In a subsequent processing step 70, the electrical conducting medium 44 which is again present in the solid aggregate state, is surrounded by the insulating body 26, which is applied with the 3D printer 28. In a further embodiment (not disclosed in detail), the application of the insulating body 26 takes place by means of dip coating, spraying, dispensing or painting on.

Hereby, by means of the electrical conducting medium 44, all the surfaces which do not abut the circuit carrier 4 are surrounded by the insulating body 26.

In a further embodiment (not disclosed in detail), the insulating body 26 is created according to the variant in FIG. 5 and the electrical conducting medium 44 is placed in the solid aggregate state into the insulating body 26 according to the arrangement shown in FIG. 10 or 11. Subsequently thereto, the electrical conducting medium 44 is heated by the heating device 66 so that it fills the insulating body 26 as shown in FIG. 6. Subsequently thereto, the insulating body 26 is closed with the cover 54.

Summarizing, the insulating body 26 is used, which apart from the function as electrical insulation, accommodates and therefore stabilizes the electrical conducting medium 44. The insulating body 26 is configured as a hollow body and serves as a molding channel, wherein in particular alternatives, it comprises the pouring-in opening 36, the ventilation opening 38 and the cut-outs 34. The insulating body 26 is preferably created by means of molding with lost cores or by means of 3D printing onto the substrate 6, and the power semiconductor (switches) 10 are connected integrally bonded to the substrate 6 on one side by means of sintering, adhering or soldering. Subsequently to the connecting, the creation of the insulating body 26 takes place.

After the creation, the low-viscosity or liquid electrical conducting medium 44 which is, for example, Galinstan or another metal alloy that is fluid during the pouring-in phase, is poured into the insulating body 26, for example via the pouring-in opening 36 or the opening 52. In further alternatives, the electrical conducting medium 44 is a paste composed of conductive particles with binders which harden after the pouring in. Once the electrical conducting medium 44 is poured in, by wetting and/or alloy formation, an electrical junction on the two contact areas 14, 16 can be formed. The contacting can also take place via a binding agent cross-linking or a change in the alloy composition. Provided the electrical conducting medium 44 also remains in the fluid state during operation, the insulating body 26 is closed, in particular by means of the cap 48 or the cover 54. If the electrical conducting medium 44 is poured in by means of the injection device 56, on the basis of a relaxation of the material of the insulating body 26 in the region of the introduction of the needle 58, an autonomous closing takes place, so that the insulating body 26 is sealed.

In a further alternative, the insulating body 26 is constructed in the manner of a trough into which the electrical conducting medium 44 is introduced and which is subsequently covered over by means of the cover 54. In a further alternative, a solder preform or another preform/insert part which is transitioned by thermal initiation by means of the heating device 66 below the decomposition temperature of the material of the insulating body 26 into the molten state is used at the electrical conducting medium 44, wherein the surface topography is molded so that the electrical conducting medium 44 is conformed to the surface topography of the circuit carrier 6 and forms the electrical contact with the two contact areas 14, 16. Subsequently, the covering of the electrical conducting medium 44 by means of the insulating body 26 takes place such that even during melting, the electrical conducting medium 44 is held in a fixed location during operation.

On the basis of the electrical conducting medium 44, in a relatively short time, an electrical conductor which has a relatively large cross-section and thus has a large current-carrying capacity is provided. Therefore, as the electrical conducting medium 44, one such with a relatively low electrical conductivity can also be used.

The invention is not restricted to the above described exemplary embodiments. Rather, other variations can also be derived therefrom by a person skilled in the art without departing from the subject matter of the invention. In particular, all the individual features described in relation to the individual exemplary embodiments are also combinable with one another differently without departing from the subject matter of the invention.

What is claimed is:

1. A method for producing an electric circuit, said method comprising:
   forming an insulating body by molding, in which a lost core is used, or by 3D printing;
   applying the insulating body to a circuit carrier such as to cover a first contact area and a second contact area at least partially, with the insulating body having a cut-out in a region of the first contact area and a cut-out in a region of the second contact area; and
   pouring a flowable electrical conducting medium into the insulating body.

2. The method of claim 1, wherein the electrically conducting medium is an alloy which includes at least partially gallium, indium and/or tin.

3. The method of claim 1, wherein the electrically conducting medium is a medium with an electrical conductivity that is less than an electrical conductivity of copper.

4. The method of claim 1, wherein the electrically conducting medium is a medium with an electrical conductivity that is less than half an electrical conductivity of copper.

5. The method of claim 1, further comprising hardening the electrical conducting medium.

6. The method of claim 1, wherein the insulating body is formed with a pouring-in opening and/or a ventilation opening.

7. The method of claim 6, further comprising closing the pouring-in opening and/or the ventilation opening after pouring in the electrical conducting medium.

8. The method of claim 1, wherein the insulating body is formed with a trough-like configuration.

9. The method of claim 8, further comprising placing a cover upon the insulating body after pouring in the electrical conducting medium.

10. The method of claim 1, wherein the insulating body is formed with a closed configuration, except for the cut-outs in the regions of the first and second contact areas, wherein the electrical conducting medium is injected into the insulating body.

11. An electric circuit, comprising a circuit carrier, said circuit carrier comprising first and second contact areas, an electrical conducting medium establishing an electrical contact between the first and second contact areas, and an insulating body at least partially surrounding the electrical conducting medium, said electric circuit being produced by a method as set forth in claim 1.

12. The electric circuit of claim 11, wherein the electrically conducting medium is an alloy which includes at least partially gallium, indium and/or tin.

13. The electric circuit of claim 11, wherein the electrically conducting medium is a medium with an electrical conductivity that is less than an electrical conductivity of copper.

14. The electric circuit of claim 11, wherein the electrically conducting medium is a medium with an electrical conductivity that is less than half an electrical conductivity of copper.

15. The electric circuit of claim 11, wherein the insulating body is formed with a pouring-in opening and/or a ventilation opening.

16. The electric circuit of claim 11, wherein the insulating body has a trough-like configuration.

17. The electric circuit of claim 11, further comprising a cover placed upon the insulating body.

18. The electric circuit of claim 11, wherein the insulating body has a closed configuration, except for the cut-outs in the regions of the first and second contact areas.

* * * * *